United States Patent
Lyon et al.

(10) Patent No.: US 8,049,736 B2
(45) Date of Patent: *Nov. 1, 2011

(54) LOW EMI CAPACITIVE TRACKPAD

(75) Inventors: Benjamin Lyon, San Jose, CA (US);
Steven P. Hotelling, San Jose, CA (US)

(73) Assignee: Apple Inc., Cupertino, CA (US)

( * ) Notice: Subject to any disclaimer, the term of this patent is extended or adjusted under 35 U.S.C. 154(b) by 782 days.

This patent is subject to a terminal disclaimer.

(21) Appl. No.: 12/130,503

(22) Filed: May 30, 2008

(65) Prior Publication Data

US 2008/0223628 A1    Sep. 18, 2008

Related U.S. Application Data

(63) Continuation of application No. 10/948,937, filed on Sep. 24, 2004, now Pat. No. 7,394,458.

(51) Int. Cl.
*G06F 3/041* (2006.01)
(52) U.S. Cl. ........................................ 345/173; 345/156
(58) Field of Classification Search .................. 345/156, 345/173
See application file for complete search history.

(56) References Cited

U.S. PATENT DOCUMENTS

| | | | | |
|---|---|---|---|---|
| 5,767,457 A * | 6/1998 | Gerpheide et al. | ......... | 178/18.03 |
| 5,869,790 A * | 2/1999 | Shigetaka et al. | ......... | 178/18.03 |
| 5,926,171 A * | 7/1999 | Matsufusa et al. | ............ | 345/173 |
| 6,188,391 B1 * | 2/2001 | Seely et al. | .................... | 345/173 |
| 6,222,528 B1 * | 4/2001 | Gerpheide et al. | ............ | 345/173 |
| 6,242,997 B1 * | 6/2001 | Barrett et al. | ............... | 338/22 R |
| 6,762,498 B1 * | 7/2004 | Morrison et al. | ............. | 257/758 |
| 7,394,458 B2 * | 7/2008 | Lyon et al. | .................... | 345/173 |
| 7,724,243 B2 * | 5/2010 | Geaghan | ....................... | 345/173 |
| 2004/0041185 A1 * | 3/2004 | Ireland | .......................... | 257/296 |
| 2006/0066581 A1 * | 3/2006 | Lyon et al. | .................... | 345/173 |
| 2010/0073319 A1 * | 3/2010 | Lyon et al. | .................... | 345/174 |

* cited by examiner

*Primary Examiner* — Bipin Shalwala
*Assistant Examiner* — Afroza Chowdhury
(74) *Attorney, Agent, or Firm* — Wong, Cabello, Lutsch, Rutherford & Brucculeri, L.L.P.

(57) ABSTRACT

A printed circuit board (PCB) assembly provides a two layer capacitive trackpad sensor in which an EMI ground grid is interposed among the sensor's capacitive elements on each of its layers. The EMI grid on each of the two layers is electrically coupled via, typically, vias. The described arrangement of sensor elements (capacitor plates) and EMI ground grid traces may be incorporated into a PCB having additional layers (e.g., a four, six or eight layer PCB). If used in this manner, additional vias are provided on the PCB which permit electrical coupling between these "additional layers" and which are electrically isolated from, and shielded by, the EMI ground grid.

26 Claims, 5 Drawing Sheets

LOW EMI CAPACITIVE TRACKPAD

This is a continuation of, and claims priority to, U.S. patent application Ser. No. 10/948,937, entitled "Low EMI Capacitive Trackpad," filed 24 Sep. 2004, now issued as U.S. Pat. No. 7,394,458.

BACKGROUND

The invention relates generally to computer system input devices and, more particularly, to a trackpad input device having low electromagnetic interference characteristics.

A trackpad is a touch-sensing planar digitizer input device used instead of, or in conjunction with, a mouse, trackball or joy stick. During use, an operator places a finger on the trackpad and moves the finger along the touch-sensing planar surface. The trackpad detects the movement of the finger and in response provides motion signals to a computer. Typically, a trackpad software program converts the detected movement pattern into specific cursor control signals (e.g., location, direction and magnitude of motion).

There are two common types of trackpad sensor devices: resistive and capacitive. A resistive trackpad sensor is a mechanical sensor that uses two layers of material that are typically separated by air. Pressure from a finger pushes the top layer (generally a thin, clear polyester film) so that it touches the bottom layer (generally glass). The voltage at the contact point is measured and the finger's location is computed and transmitted to a host computer system. After the finger is removed, the top layer "bounces back" to its original configuration. A capacitive touchpad sensor, in contrast, is a solid-state sensor made using printed circuit board ("PCB"), flex circuit of glass substrate technology. A finger on, or in close proximity to, a top grid of conductive traces changes the capacitive coupling between adjacent traces. This change in capacitance can be measured and finger position computed.

Like virtually all electronic circuits, the computer system (e.g., notebook or other personal computer, workstation or server computer) in which a trackpad (i.e., a trackpad sensor and its associated electronics) resides generates electromagnetic interference ("EMI"). It will be recognized that such interference can cause damage or a malfunction in other computer system devices or circuits. In the past, the problem of computer EMI has generally been addressed by enclosing the computing environment (e.g., the computer system's motherboard) in a shielded volume (typically referred to as a Faraday cage) and placing the trackpad outside this volume. Often, because the trackpad must be electrically coupled to the computer system, the trackpad itself is partially enclosed in a second shielded container.

Referring to FIG. 1, for example, trackpad sensor 100 and associated circuitry 105 (collectively, the trackpad) is often partially enclosed in shielded (e.g., metal) well 110. Because volume is a critical resource in portable computers, well 110 is as small as possible—often requiring hole 115 be cut therein to permit trackpad circuitry 105 to protrude. This, unfortunately, permits EMI to escape well 110. To combat this problem, circuitry 105 and hole 115 may be covered with a copper foil pad or blanket.

Referring to FIGS. 2A and 2B, another prior art approach to combating trackpad EMI is to provide a single copper pour on the trackpad sensor's PCB. In one embodiment, trackpad sensor PCB 200 has metal layer 205 applied to its bottom surface (i.e., away from the surface providing touch-sensing). In another embodiment, trackpad sensor PCB 210 has internal metal layer 215 beneath its touch-sensing elements. A drawback to the shielding approaches of FIGS. 2A and 2B is that metal layers 205 and 215 introduce large parasitic capacitances. As one of ordinary skill in the art will recognize, such parasitic capacitances decrease the touchpad's operational signal-to-noise ratio which, in turn, can lead to lower performance and/or require additional design responses to mitigate.

It would be beneficial, therefore, to provide a touchpad sensor with low EMI characteristics without introducing large unwanted capacitances or the need to employ additional design techniques to offset the side-effects of the reduced EMI design.

SUMMARY

In one embodiment the invention provides a trackpad printed circuit board ("PCB") that provides low electromagnetic interference ("EMI") characteristics. The trackpad PCB comprises a first layer and a second layer. The first layer includes a first plurality of metal surfaces (capacitor plates) and a second plurality of metal surfaces (EMI ground grid traces) electrically isolated from, and interposed between, each pair of the first plurality of metal surfaces. The second layer includes a third plurality of metal surfaces (capacitor plates), a fourth plurality of metal surfaces (EMI ground grid traces) electrically isolated from, and interposed between, each pair of the third plurality of metal surfaces and a fifth plurality of metal surfaces (capacitor plates) electrically isolated from the third and fourth plurality of metal surfaces and, further, substantially aligned over the first plurality of metal surfaces on the first layer. The second plurality of metal surfaces on the first layer are electrically coupled to the fourth plurality of metal surfaces on the second layer through, for example, thru-hole vias. In another embodiment, two or more additional layers may be added to the trackpad PCB. In this embodiment, thru-hole vias may be provided that are electrically isolated and shielded from the trackpad sensor elements and ground grid traces (i.e., the metal surfaces).

DETAILED DESCRIPTION

Touchpad sensors that include an in-place grounding or electromagnetic interference ("EMI") grid are described. The following embodiments of the invention, described in terms of a trackpad sensor designed for use in a portable computer system are illustrative only and are not to be considered limiting in any respect.

In one embodiment, the invention provides a two-layer capacitive trackpad printed circuit board ("PCB") in which an EMI ground grid is interposed among the capacitive elements on each layer. The EMI grid on each of the two layers is further electrically coupled. In another embodiment, the afore-described arrangement of sensor elements and EMI ground grid are incorporated into a PCB having additional layers (e.g., a four, six or eight layer PCB). In this embodiment, additional vias are provided on the PCB which permit electrical coupling between traces on these "additional layers" and which are shielded (electrically isolated) by the EMI ground grid.

Figure 3A:
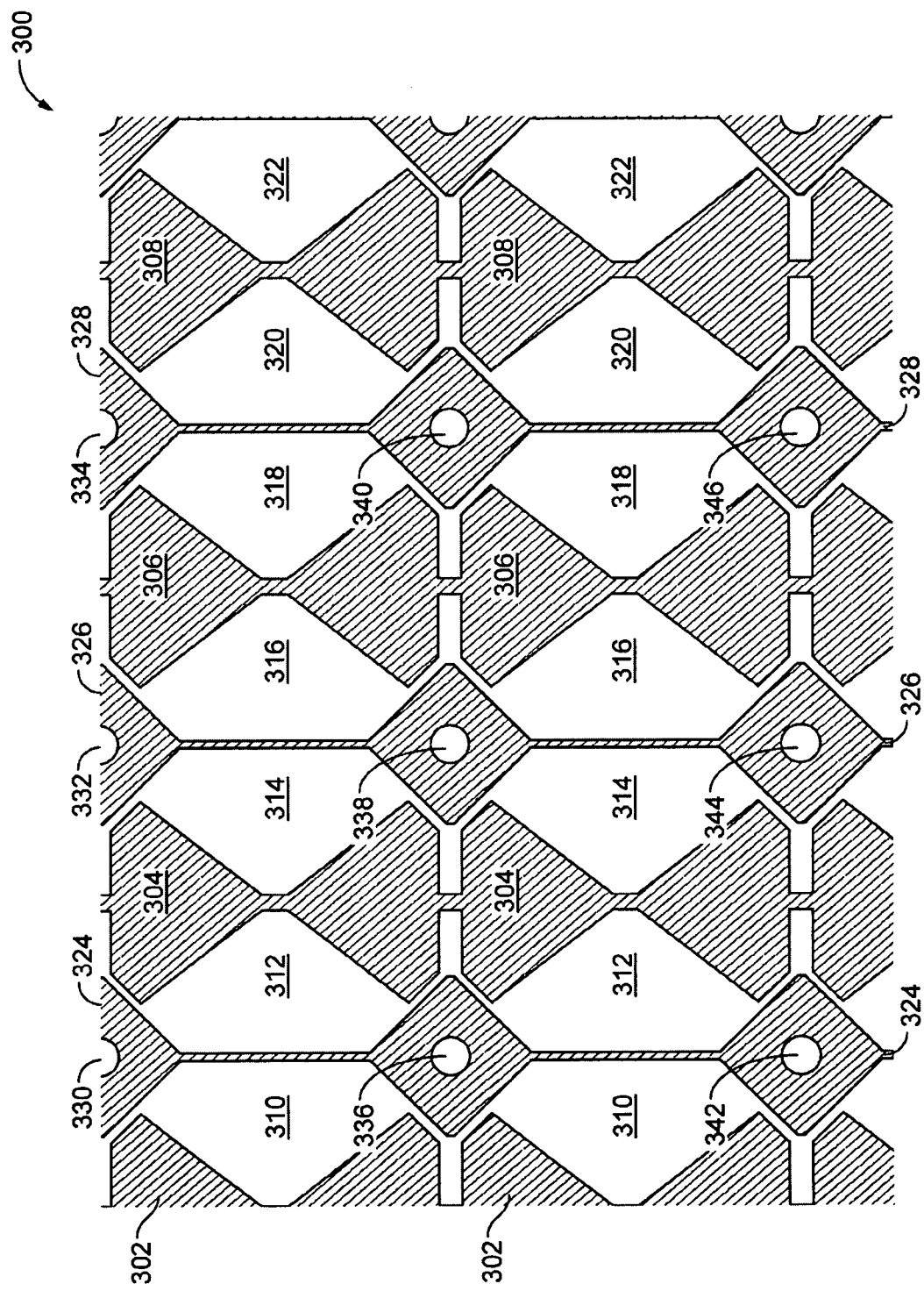
FIGS. 3A and 3B show an embodiment of a capacitive trackpad sensor in accordance with one embodiment of the invention.
Figure 3B:
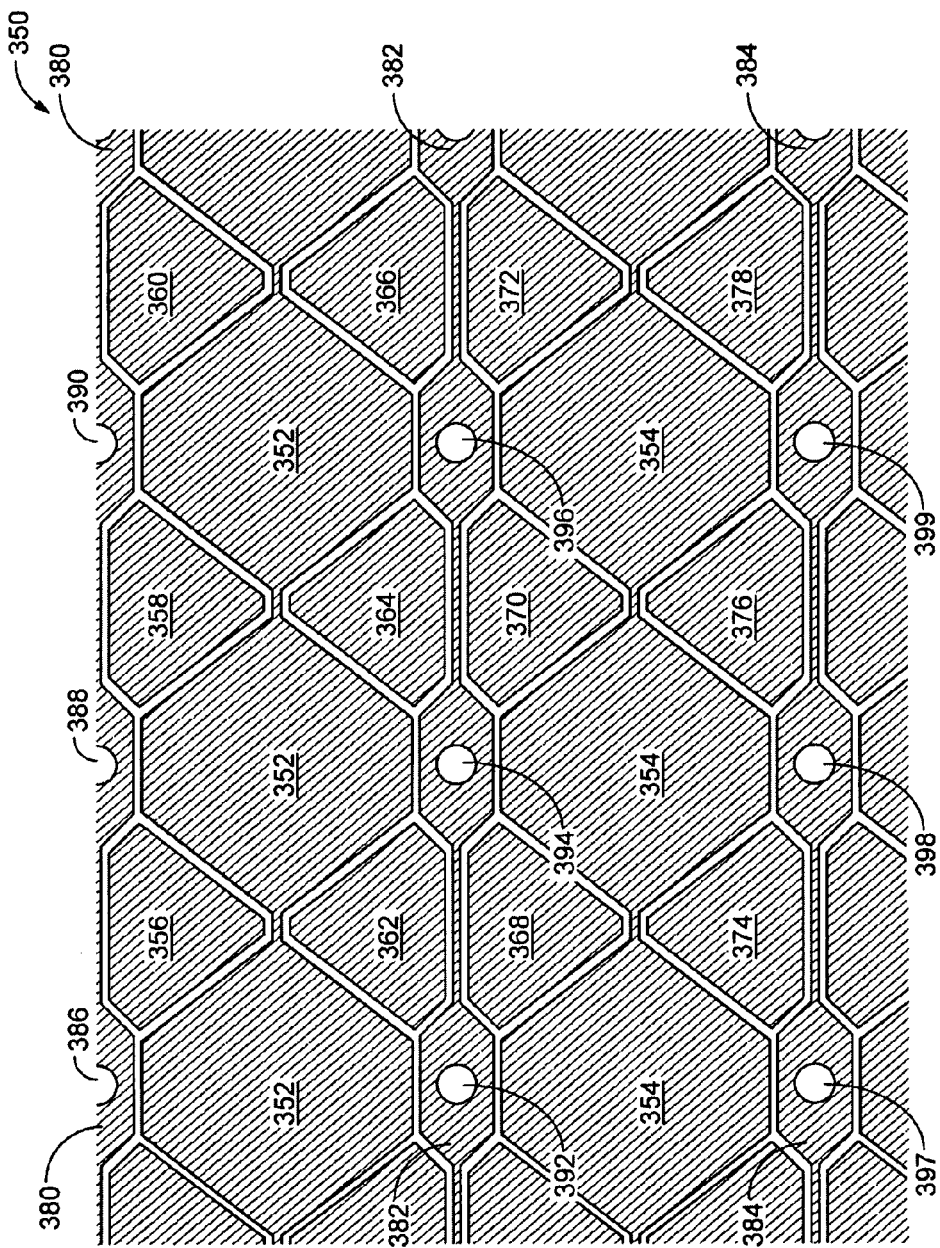

Referring to FIGS. 3A and 3B, a first embodiment of the invention is shown in which a two layer PCB includes first layer 300 (FIG. 3A) and second layer 350 (FIG. 3B). First layer 300 includes repeated column regions 302-308, void regions 310-322, EMI ground grid regions 324-328 and vias 330-346. Second layer 350 includes repeated row regions 352-354, isolated plate regions 356-378, EMI ground grid regions 380-384 and vias 386-399. When the vias of layer 300 (330-346) and layer 350 (386-399) are aligned it can be seen that: row regions 352 and 354 align with void regions 310-322; isolated plate regions 356-378 align with column regions 304-308 and layer 300's EMI ground grid regions 324-328 run substantially orthogonal to layer 350's EMI ground grid regions 380-384. During fabrication, vias in layer 300 are electrically coupled to their corresponding vias in layer 350 to form an electrically continuous EMI ground grid interposed between (and around) the sensor's capacitive plates (302-308, 352, 354 and 356-378).

Figure 4A:
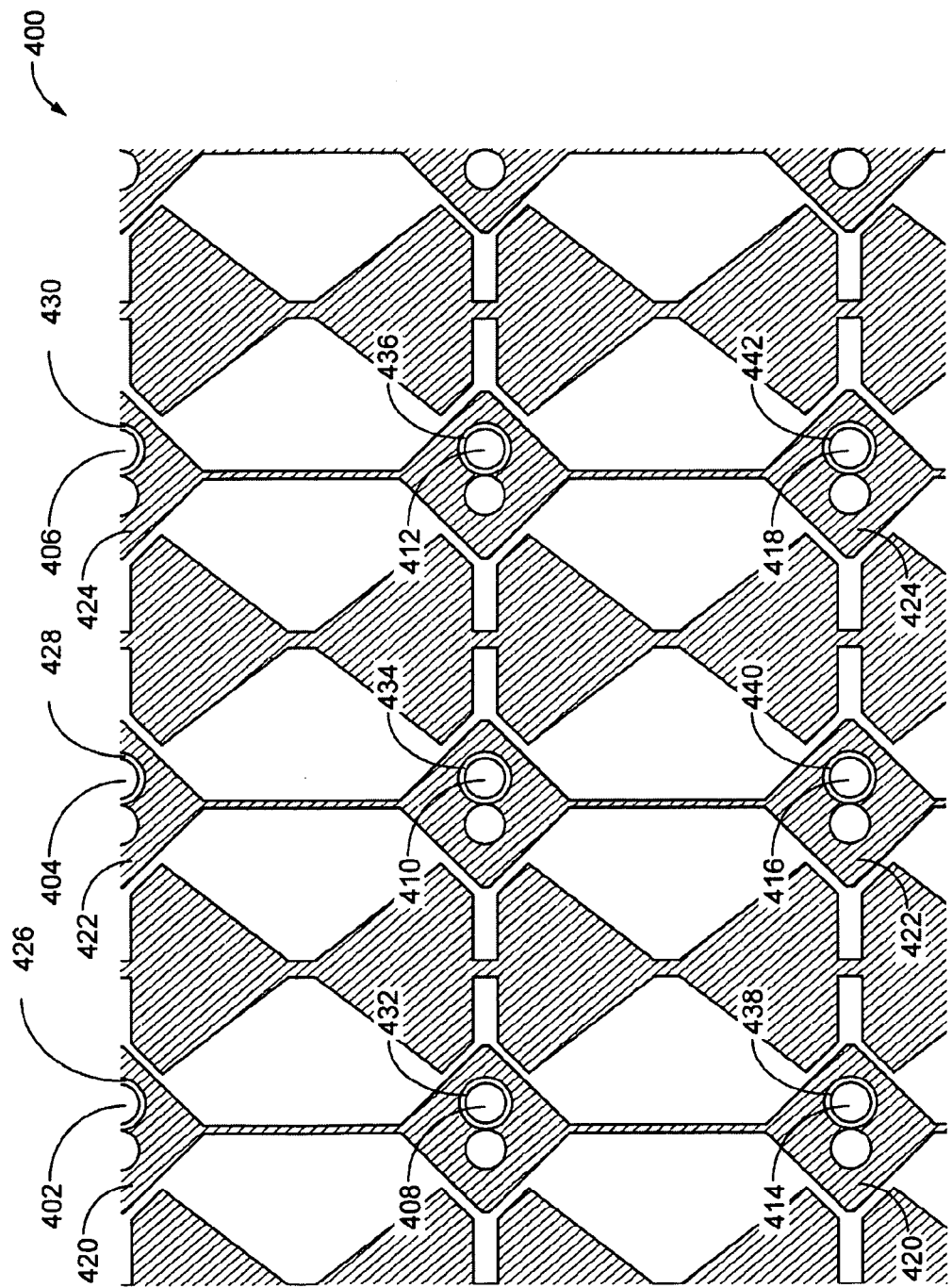
FIGS. 4A and 4B show an embodiment of a capacitive trackpad sensor in accordance with another embodiment of the invention.
Figure 4B:
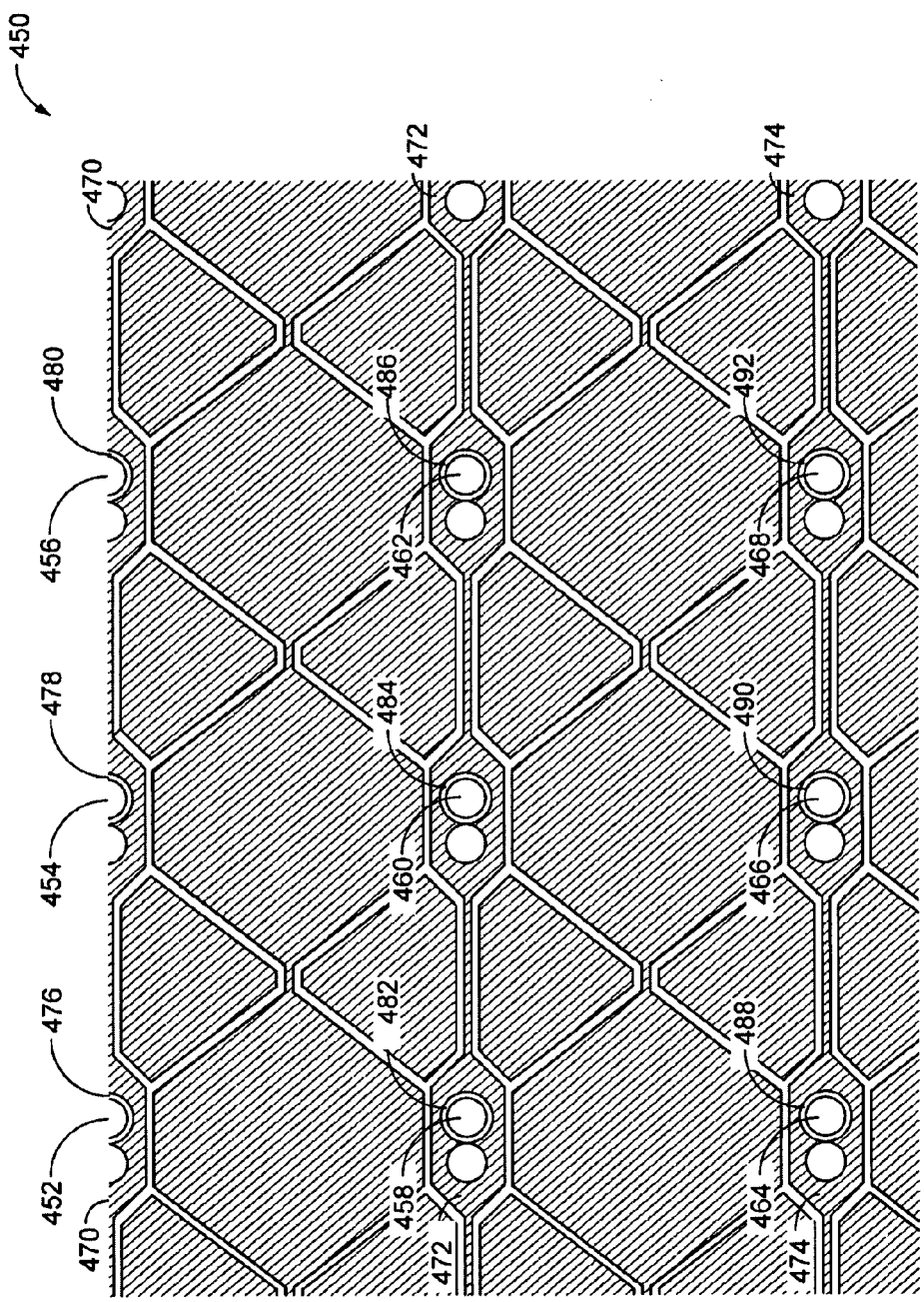

Referring to FIGS. 4A and 4B, a second embodiment of the invention is shown in which a four layer PCB includes first layer 400 (FIG. 4A) and second layer 450 (FIG. 4B) substantially in accord with FIGS. 3A and 3B. In contrast to the embodiment of FIGS. 3A and 3B, however, additional PCB layers (not shown) are provided and additional vias (402-418 and 452-468) are incorporated into the EMI ground grid (420-424 and 470-474) to permit electrical connectivity between components (e.g., electrical traces and/or devices) in or on the additional PCB layers. It is significant that the additional vias are electrically isolated from the EMI ground grid by annular regions (426-442 and 476-492). This annular (void) region permits the vias to be used to couple traces between the additional PCB layers without interfering with, or being interfered by, the operation of the trackpad sensor. That is, the EMI ground grid acts as a shield to both the trackpad sensor elements and the additional signal vias. One of ordinary skill in the art will recognize that PCBs having more than two layers typically isolate adjacent layers (i.e., formed on the top of a first PCB core and the bottom of a second, adjacent, PCB core) with an insulating material such as, for example, by preimpregnated bonding layer material or "PREPREG."

In one illustrative embodiment, a 2" by 4" capacitive touchpad sensor has been fabricated in a 4-layer PCB having a total thickness of approximately 0.5 millimeter ("mm"). Because the sensor and EMI ground grid consume only two layers, the other two layers may be used for circuitry that detects and processes the sensor's output signals. In this embodiment, the sensor comprises 32 columns and 16 rows. Each isolated plate region (e.g., 356) is approximately 3 mm by 1.5 mm, each row region area is approximately 3.1 mm by 3.1 mm, EMI ground grid intersection regions (the area surrounding the vias) are approximately 1 mm by 2 mm, vias are mechanically drilled thru-holes of approximately 0.2 mm in diameter and the annular region surrounding the non-EMI ground grid coupled via is approximately 0.05 to 0.1 mm in width. The width of the voids separating isolated plates and rows in layer 350 and the connective path between EMI ground grid intersection regions (e.g., in both layers 400 and 450) are approximately 0.1 mm. In this particular embodiment, all metal regions (columns, rows, isolated plates and ground grid) use 0.5 ounce copper. The 4-layer PCB is a standard woven epoxy glass material (FR4) and the layers between PCB substrates are separated by preimpregnated bonding layer material or PREPREG. One of ordinary skill in the art will recognize that other sizes, PCB materials, types of metal and metal thickness may be used without departing from the described invention.

Figure 1:
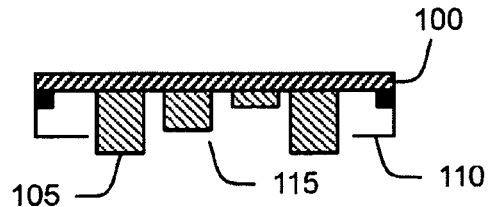
FIG. 1 shows a prior art touchpad enclosed in a shielded well.
Figure 2A:
FIGS. 2A and 2B show prior art touchpad designs.
Figure 2B:
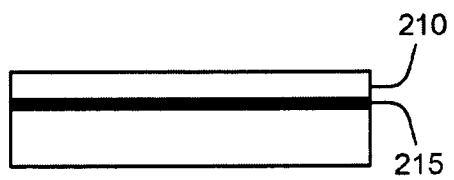
Figure 5:
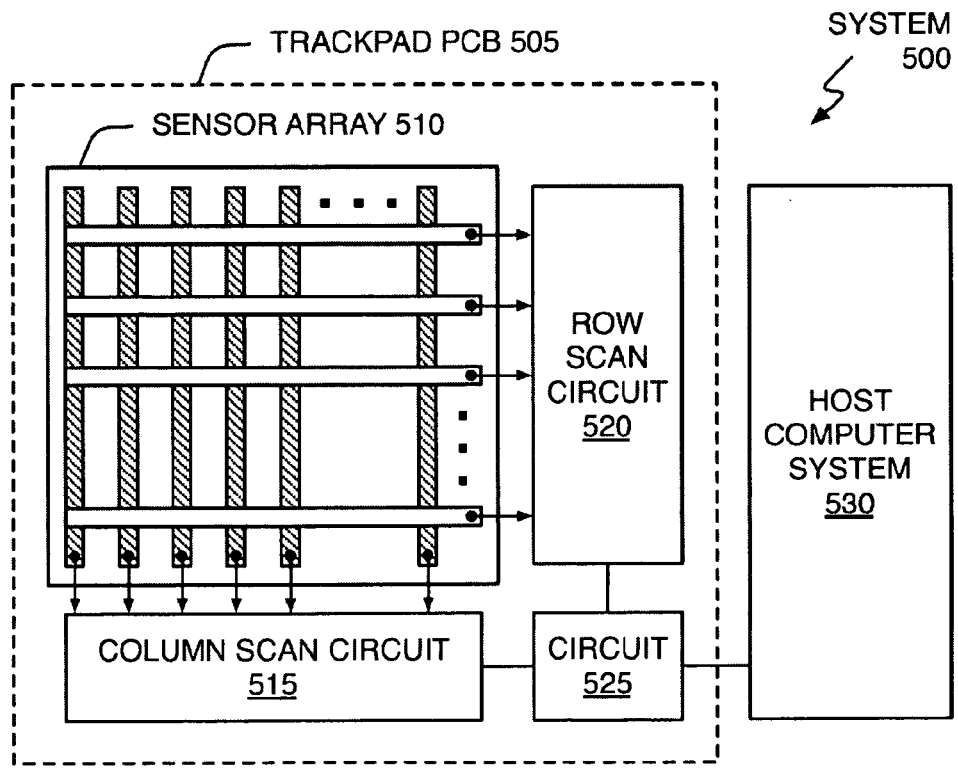
FIG. 5 shows a computer system incorporating a low EMI capacitive trackpad in accordance with the invention.

Referring to FIG. 5, a trackpad sensor PCB in accordance with the invention may be used in computer system 500. In this particular embodiment, trackpad PCB 505 includes sensor array 510 (as described with respect to FIGS. 3A, 3B, 4A and 4B), column scan circuit 515, row scan circuit 520 and sensor processing circuit 525. Trackpad PCB 505 is coupled to host computer system 530 through any convenient means such as, for example, a flex-cable or rigid connector. As shown, each column of sensor elements in sensor array 510 (see FIGS. 3A and 4A) is electrically coupled to column scan circuit 520. Similarly, each row of sensor elements in sensor array 510 (see FIGS. 3B and 4B) is electrically coupled to row scan circuit 520. In practice, column scan circuit 515, row scan circuit 520 and processing circuit 525 may be affixed to trackpad PCB 505 on the surface opposite that of sensor array 510. Interconnections to and between these circuits may be made via the additional signal vias embedded in, but electrically isolated from, sensor array 510's EMI ground grid (see FIGS. 4A and 4B). As noted above, because the additional signal vias are shielded by the EMI ground grid, signals between circuits 515, 520 and 530 do not interfere with, nor are they interfered by, signals associated with operation of sensor array 510.

One benefit of a capacitive touchpad in accordance with the invention is the improved signal-to-noise performance compared to prior art touchpad sensors. Another benefit of a capacitive touchpad in accordance with the invention is the ability to incorporate an EMI ground grid within the sensor array itself and, thereby, reduce the need for additional and external EMI shielding. Yet another benefit of a capacitive touchpad in accordance with the invention is the ability to incorporate a capacitive sensor array in a multilayer PCB that permits additional circuitry to be interconnected in and on the PCB without extensive EMI between the sensor and these additional circuits. Still another benefit of a capacitive touchpad in accordance with the invention is the ability to use standard thru-hole vias for both EMI ground grid interconnectivity as well as transport of additional signals. While trackpad sensors may be constructed in accordance with the invention that do not use thru-hole vias, it will be recognized by one of ordinary skill in the art that thru-hole vias are the most cost-effective technique to provide interlayer connectivity.

Various changes in the materials and geometrical arrangement of the described embodiments are possible without departing from the scope of the following claims. For instance, a capacitive trackpad sensor in accordance with the invention may have a top-most layer comprising column elements and a lower layer comprising row elements—opposite to the illustrative embodiments of FIGS. 3A, 3B, 4A and 4B. In addition, the geometrical layout of sensor column elements (i.e., column capacitor plates), row elements (i.e., row capacitor plates) and EMI ground grid traces do not have to be regularly laid out on the hosting PCB. It will be recognized, however, that for proper function metal plates in one layer (e.g., metal surfaces 302-308) should be substantially aligned with corresponding metal plates in the other layer (e.g., metal surfaces 356-378). It will also be recognized by one of ordinary skill in the art that PCBs may be fabricated from a number of carrier materials such as, for example, CEM-1 (a laminate having a substrate of woven glass surfaces over a cellulose paper core and a resin binder of epoxy), FR-2 (a laminate having a substrate of paper and a resin binder of phenolic), FR-4 (a laminate having a substrate of woven-glass fabric and resin binder of epoxy), FR-6 (a glass-and-polyester substrate material) and polytetrafluoroethylene (Teflon®). In addition, other substrates are possible such as, for example, flexboards and glass. It will further be recognized by one of ordinary skill in the art that vias may be formed mechanically (i.e., drilling) or optically (i.e., laser) and that the described annular regions should be big enough (taking into consideration fabrication tolerances) to ensure that the associated vias are electrically isolated from the surrounding EMI ground grid trace.

The preceding description was presented to enable any person skilled in the art to make and use the invention as claimed and is provided in the context of the particular examples discussed, variations of which will be readily apparent to those skilled in the art. Accordingly, the claims appended hereto are not intended to be limited by the disclosed embodiments, but are to be accorded their widest scope consistent with the principles and features disclosed herein.

The invention claimed is:

1. A touch sensor circuit board, comprising:
    a first layer having a first plurality of metal surfaces and a second plurality of metal surfaces electrically isolated from, and interposed between, each pair of the first plurality of metal surfaces, wherein each of the first plurality of metal surfaces are electrically isolated from each other and, further, wherein each of the second plurality of metal surfaces are electrically coupled to each other; and
    a second layer having a third plurality of metal surfaces that are aligned substantially orthogonal to the first plurality of metal surfaces and a fourth plurality of metal surfaces electrically isolated from, and interposed between, each pair of the third plurality of metal surfaces, wherein each of the third plurality of metal surfaces are electrically isolated from each other and, further, wherein each of the fourth plurality of metal surfaces are electrically coupled to each other.

2. The touch sensor circuit board of claim 1, wherein the second plurality of metal surfaces are electrically coupled to a fixed voltage reference.

3. The touch sensor circuit board of claim 2, wherein the fixed voltage reference comprises ground.

4. The touch sensor circuit board of claim 1, wherein the second plurality of metal surfaces are electrically coupled to the fourth plurality of metal surfaces.

5. The touch sensor circuit board of claim 4, wherein the second and fourth plurality of metal surfaces are electrically coupled to a fixed voltage reference.

6. The touch sensor circuit board of claim 5, wherein the fixed voltage reference comprises ground.

7. The touch sensor circuit board of claim 1, wherein the second layer further comprises a fifth plurality of metal surfaces that are electrically isolated from the third and fourth plurality of metal surfaces and, further, substantially aligned over the first plurality of metal surfaces.

8. The touch sensor circuit board of claim 1, further comprising two or more additional layers.

9. The touch sensor circuit board of claim 8, further comprising vias for electrically coupling between the two or more additional layers, wherein the vias are electrically isolated from the first and second plurality of metal surfaces and extend through the second plurality of metal surfaces in the first layer and the two or more additional layers.

10. The touch sensor circuit board of claim 1 wherein one or more of the metal surfaces comprise copper metal surfaces.

11. The touch sensor circuit board of claim 1 wherein the first and second layers comprise two sides of a common substrate.

12. The touch sensor circuit board of claim 1 wherein the second and fourth plurality of metal surfaces are electrically coupled.

13. The touch sensor circuit board of claim 1, wherein the first and second layers are separated by a preimpregnated bonding layer material.

14. The touch sensor circuit board of claim 1, wherein each of the first plurality of metal surfaces are electrically coupled to a first electrical circuit for processing touch sensor output signals.

15. The touch sensor circuit board of claim 1, wherein each of the first plurality of metal surfaces are electrically coupled to a first electrical circuit for processing touch sensor output signals and each of the third plurality of metal surfaces are electrically coupled to a second electrical circuit for processing touch sensor output signals.

16. A method to fabricate a touch sensor circuit board, comprising:
    forming, on a first surface of a substrate, a first plurality of metal surfaces;
    forming, on the first surface, a second plurality of metal surfaces electrically isolated from, and interposed between, each pair of the first plurality of metal surfaces, wherein each of the first plurality of metal surfaces are electrically isolated from each other and, further, wherein each of the second plurality of metal surfaces are electrically coupled to each other
    forming, on a second surface of the substrate, a third plurality of metal surfaces that are aligned substantially orthogonal to the first plurality of metal surfaces; and
    forming, on the second surface, a fourth plurality of metal surfaces electrically isolated from, and interposed between, each pair of the third plurality of metal surfaces, wherein each of the third plurality of metal surfaces are electrically isolated from each other and, further, wherein each of the fourth plurality of metal surfaces are electrically coupled to each other.

17. The method of claim 16, further comprising forming an electrical connection between the second plurality of metal surfaces to an electrical reference.

18. The method of claim 17, wherein the electrical reference comprises a ground.

19. The method of claim 16, further comprising forming an electrical connection between the second and fourth plurality of metal surfaces.

20. The method of claim 19, further comprising forming an electrical connection between the second plurality of metal surfaces and an electrical reference.

21. The method of claim 20, wherein the electrical reference comprises a ground.

22. The method of claim 16, further comprising forming, on the second surface, a fifth plurality of metal surfaces that are electrically isolated from the third and fourth plurality of metal surfaces and, further, substantially aligned over the first plurality of metal surfaces on the first surface.

23. The method of claim 22, further comprising forming electrical connections between the second plurality of metal surfaces and the fourth plurality of metal surfaces.

24. The method of claim 16, wherein the act of forming the first and second metal surfaces comprises forming said surfaces with copper metal.

25. The method of claim 16, further comprising establishing electrical connections between each of the first plurality of metal surfaces and an electrical circuit for processing touch sensor output signals.

26. The method of claim 22, further comprising:
   establishing electrical connections between each of the first plurality of metal surfaces and a first electrical circuit for processing touch sensor output signals; and
   establishing electrical connections between each of the third plurality of metal surfaces and a second electrical circuit for processing touch sensor output signals.

* * * * *